(12) United States Patent
Yamamoto

(10) Patent No.: US 7,807,932 B2
(45) Date of Patent: Oct. 5, 2010

(54) PRINTED CIRCUIT BOARD AND METHOD FOR MANUFACTURING THE SAME

(75) Inventor: Tatsunori Yamamoto, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 662 days.

(21) Appl. No.: 11/589,905

(22) Filed: Oct. 31, 2006

(65) Prior Publication Data

US 2007/0107930 A1  May 17, 2007

(30) Foreign Application Priority Data

Nov. 15, 2005  (JP) .............................. 2005-330657

(51) Int. Cl.
*H01R 12/04* (2006.01)
*H05K 1/11* (2006.01)

(52) U.S. Cl. .................. 174/262; 174/260; 174/261; 361/774; 361/777; 361/788; 361/789

(58) Field of Classification Search .............. 174/262, 174/260, 261; 257/673; 361/760, 770, 773, 361/774, 777–779
See application file for complete search history.

(56) References Cited

U.S. PATENT DOCUMENTS

| | | | | |
|---|---|---|---|---|
| 5,046,953 A | * | 9/1991 | Shreeve et al. ................ | 439/66 |
| 5,361,490 A | * | 11/1994 | Higgins et al. ................ | 29/827 |
| 6,395,998 B1 | * | 5/2002 | Farquhar et al. ............. | 174/260 |
| 6,778,403 B2 | * | 8/2004 | Takenaka et al. ............. | 361/760 |
| 2005/0274689 A1 | * | 12/2005 | Sakata et al. .................. | 216/13 |
| 2006/0001361 A1 | * | 1/2006 | Imai et al. .................... | 313/498 |
| 2006/0214282 A1 | * | 9/2006 | Sakata ......................... | 257/701 |

FOREIGN PATENT DOCUMENTS

| | | |
|---|---|---|
| CN | 1516544 A | 7/2004 |
| JP | 62-113494 A | 5/1987 |
| JP | 7-142849 A | 6/1995 |
| JP | 2000-12991 A | 1/2000 |
| JP | 2001-352155 A | 12/2001 |
| JP | 2002-190657 A | 7/2002 |

\* cited by examiner

*Primary Examiner*—Hung S Bui
*Assistant Examiner*—Andargie M Aychillhum
(74) *Attorney, Agent, or Firm*—Birch, Stewart, Kolasch & Birch, LLP

(57) ABSTRACT

An embodiment of a printed circuit board according to the present invention is provided with an insulating layer, a conductive layer that is laminated on the insulating layer and that has a connecting portion and a circuit pattern portion formed connected to the connecting portion, and a film cover layer that covers the insulating layer and the conductive layer via an adhesive layer and that has an opening for connecting a mounted component to the connecting portion. The circuit pattern portion is provided with a recessed portion that is concave with respect to the connecting portion.

18 Claims, 14 Drawing Sheets

US 7,807,932 B2

PRINTED CIRCUIT BOARD AND METHOD FOR MANUFACTURING THE SAME

BACKGROUND OF THE INVENTION

This application claims priority under 35 U.S.C. §119(a) on Patent Application No. 2005-330657 filed in Japan on Nov. 15, 2005, the entire contents of which are hereby incorporated by reference.

The present invention relates to printed circuit boards and methods for manufacturing the same in which a circuit pattern is insulated by a film cover layer.

Flexible printed circuit boards and the like (hereinafter simply referred to as "printed circuit board") are known as conventional printed circuit boards provided with a film cover layer.

A conventional printed circuit board is described using FIGS. 9 to 14.

FIG. 9 is a cross-sectional view showing a schematic cross section of a printed circuit board according to Conventional Example 1.

FIG. 10A is an explanatory diagram illustrating a schematic broken plane of principal components of the printed circuit board shown in FIG. 9 using an isometric projection technique and FIG. 10B shows an enlargement of an opening indicated by a circle portion B in FIG. 10A. It should be noted that in FIG. 10A, a plating layer is shown cut midway in the opening, and in FIG. 10B the plating layer is omitted and a connecting portion is exposed.

A base material of a printed circuit board 101 of Conventional Example 1 is constituted by an insulating layer 110 and a conductive layer 111 laminated on the insulating layer 110. The conductive layer 111 is subjected to appropriate patterning, thereby forming a connecting portion 112 and a circuit pattern portion 113 (process of forming a wiring pattern). The connecting portion 112 includes terminal portions for achieving connection externally, and the circuit pattern portion 113 is a circuit wiring portion that is integrally formed connected to the connecting portion 112.

The connecting portion 112 and the circuit pattern portion 113 are covered by a film cover layer 115 via an adhesive layer 114 constituted by a thermosetting adhesive agent to secure mutual insulation between the outside and the wiring pattern and to improve reliability (process of forming a cover layer).

It should be noted that after an opening 116 is opened in advance so as to correspond to the connecting portion 112, the adhesive layer 114 and the film cover layer 115 are aligned with the insulating layer 110 and the conductive layer 111 so as to abut thereagainst, and thermocompression bonded by being subjected to heat and pressure.

After the film cover layer 115 has been placed, a plating layer 117 is formed on (a top surface 112s of) the connecting portion 112 so that a mounted component 120, such as an electrical component to be mounted, can be connected to the connecting portion 112.

When the film cover layer 115 is thermocompression bonded to the base material (the insulating layer 110 and the conductive layer 111), the adhesive layer 114 outflows in a horizontal direction since it is compressed by the applied pressure such that it is pushed out to form an adhesive agent outflow portion 114a. That is, adhesive agent protrudes from the adhesive layer 114 at the opening 116 that is provided in advance in the film cover layer 115.

Since the adhesive agent outflow portion 114a covers the top surface 112s of the connecting portion 112, a region formed by the plating layer 117 becomes covered by the adhesive agent such that sometimes a sufficient connecting surface area cannot be achieved between the plating layer 117 and the connecting portion 112.

When there is not a sufficient connecting surface area between the plating layer 117 and the connecting portion 112, there are problems such as reduced reliability due to increased contact resistance with the mounted component 120 and at times also connection defects, which result in reduced yields.

The following techniques (Conventional Example 2 to Conventional Example 5) have been conceived as measures to address this problem.

In Conventional Example 2, in order to suppress the adhesive agent outflow portion 114a that flows out to be formed at the opening 116 of the film cover layer 115, an adhesive layer 114 (a film cover layer 115) is employed in which the adhesive agent has little outflow volume.

However, even when selecting and using an adhesive layer in which the adhesive agent has little outflow volume and the adhesive agent outflow portion 114a that has been formed is small, unevenness is produced in the adhesive agent outflow portion 114a due to unevenness in the thickness and hardness of the film cover layer 115 and/or the adhesive layer 114 in each lot.

In particular, since a physical means for suppressing outflow of the adhesive agent outflow portion 114a is not provided in the connecting portion 112, which requires the adhesive agent outflow portion 114a to be suppressed, there is the problem that it is difficult to suppress the formation of the adhesive agent outflow portion 114a to the connecting portion 112 and that the plating layer 117 cannot be formed stably.

Conventional example 3 involves inhibiting and controlling the pressing force onto the film cover layer 115 by a thermal press when thermocompression bonding is carried out.

This has the problems that configuring (the thickness and hardness) of a cushioning material arranged between the thermal press and the printed circuit board 101 (film cover layer 115) in thermocompression bonding and managing the pressure in thermocompression bonding are difficult, that there is unevenness in the thickness and hardness of the adhesive layer 114 depending on the lot of the film cover layer 115, and moreover that there are differences in the outflow volume of the adhesive agent outflow portion 114a due to which position the opening is provided is in the printed circuit board.

In particular, because thermocompression bonding is carried out on a flat board shape, the pressure load varies depending on whether or not there is the conductive layer 111 (the connecting portion 112 and the circuit pattern portion 113), thereby producing differences in the shape of the adhesive agent outflow portion 114a. Furthermore, as in Conventional Example 2, since a physical means for suppressing outflow of the adhesive agent outflow portion 114a is not provided in the connecting portion 112, there is the problem that it is difficult to suppress the formation of the adhesive agent outflow portion 114a to the connecting portion 112 and that the plating layer 117 cannot be formed stably.

FIG. 11 is a cross-sectional view showing a schematic cross section of a printed circuit board according to Conventional Example 4. FIG. 12A is an explanatory diagram illustrating a schematic broken plane of principal components of the printed circuit board shown in FIG. 11 using an isometric projection technique and FIG. 12B shows an enlargement of an opening indicated by a circle portion B in FIG. 12A.

It should be noted that in FIG. 12A, a plating layer is shown cut midway in the opening, and in FIG. 12B the plating layer and an ink cover layer are omitted and a connecting portion is exposed. Furthermore, identical symbols are attached to the same structures as in Conventional Example 1 and detailed description thereof is omitted.

In Conventional Example 4, an ink cover layer 115a is printed to achieve insulation in locations where control management of (the outflow volume of adhesive agent of) the adhesive agent outflow portion 114a is difficult.

Such a technique is generally used in the case of intricate wiring patterns and involves making in advance the opening 116 of the film cover layer 115 larger than required, then performing thermocompression bonding on the film cover layer 115, after which the ink cover layer 115a is printed to form an intricate insulating layer (the ink cover layer 115a) and an opening 115b.

Since Conventional Example 4 involves providing in advance the opening 116 larger than required in the film cover layer 115 then printing the ink cover layer 115a after performing thermocompression bonding on the film cover layer 115, it is possible to ensure that there is no adhesive agent outflow portion 114a produced on the connecting portion 112 (top surface 112s). However, costs are increased since there is an increase in the materials used and in the processing; moreover there is a risk of reduced yields when printing defects occur during printing of the ink cover layer 115a.

FIG. 13 is a cross-sectional view showing a schematic cross section of a printed circuit board according to Conventional Example 5. FIG. 14A is an explanatory diagram illustrating a schematic broken plane of principal components of the printed circuit board shown in FIG. 13 using an isometric projection technique and FIG. 14B shows an enlargement of an opening indicated by a circle portion B in FIG. 14A.

It should be noted that in FIG. 14A, a plating layer is shown cut midway in the opening, and in FIG. 10B the plating layer is omitted and a connecting portion is exposed. Furthermore, identical symbols are attached to the same structures as in Conventional Example 1 and detailed description thereof is omitted.

With Conventional Example 5, the opening 116 of the film cover layer 115 is not formed before thermocompression bonding, but the film cover layer 115 is thermocompression bonded onto the base material, after which the opening 116 is provided by etching the film cover layer 115 and the adhesive layer 114.

In Conventional Example 5, since the opening 116 is formed after the film cover layer 115 is thermocompression bonded, no adhesive agent outflow portion 114a is produced. However, since it is necessary to perform etching on the film cover layer 115 and the adhesive layer 114, different equipment is required other than the equipment for performing patterning on the conductive layer 111, which presents problems such as maintaining equipment and increased costs, and therefore this technique is not ordinarily employed. It should be noted that Conventional Example 5 is disclosed in JP S62-113494A for example.

SUMMARY OF THE INVENTION

The present invention has been devised in consideration of these issues, and it is an object thereof to provide a printed circuit board and a method for manufacturing the same, being a printed circuit board comprising a conductive layer that is laminated on an insulating layer and that has a connecting portion for connecting a mounted component to be mounted and a circuit pattern portion formed connected to the connecting portion, and a film cover layer that covers the insulating layer and the conductive layer via an adhesive layer and that has an opening for connecting the mounted component to the connecting portion, thereby enabling a plating layer to be formed stably on the connecting portion without adhesive agent that outflows from the adhesive layer covering a top surface of the connecting portion.

In the printed circuit board according to the present invention comprising an insulating layer, a conductive layer that is laminated on the insulating layer and that has a connecting portion for connecting a mounted component to be mounted and a circuit pattern portion formed connected to the connecting portion, and a film cover layer that covers the insulating layer and the conductive layer via an adhesive layer and that has an opening for connecting the mounted component to the connecting portion, the circuit pattern portion has a recessed portion that is concave with respect to the connecting portion.

With this configuration, since excess adhesive agent of the adhesive layer can be accommodated by the recessed portion, it becomes possible to suppress outflow of adhesive agent from the adhesive layer to the opening and prevent the adhesive agent from covering the connecting portion such that the connecting portion can be kept clean, and therefore a printed circuit board is achieved in which a plating layer can be reliably formed on the connecting portion. Moreover there is an effect that a highly reliable printed circuit board can be provided in which there is no increase in contact resistance and no connection defects, and moreover high yields are provided.

In the printed circuit board according to the present invention, an outer periphery of the connecting portion is enclosed by an inner periphery of the opening.

With this configuration, since a wall is present due to the recessed portion between the outer periphery of the connecting portion and the inner periphery of the opening, outflow adhesive agent that has out flowed from the adhesive layer can be constrained by the wall, and it becomes possible to reliably prevent the connecting portion from being covered by the adhesive agent.

In the printed circuit board according to the present invention, a difference in level between the connecting portion and the recessed portion is set greater than 20% of a thickness of the adhesive layer.

With this configuration, it becomes possible to reliably constrain the adhesive agent outflow portion even when there is unevenness in the materials and processes of the adhesive agent and the like while suitably maintaining the thickness of the conductive layer.

In the printed circuit board according to the present invention, the recessed portion is formed straddling the opening.

With this configuration, it is possible to suppress outflow of adhesive agent from the adhesive layer to the opening, and the adhesive agent outflow portion can be restrained.

In the printed circuit board according to the present invention, the recessed portion is formed so as to become incrementally shallower farther from the opening.

With this configuration, the cross section area of the conductive layer of the circuit pattern portion corresponding to the recessed portion can be secured and therefore it is possible to suppress increases in the wiring resistance.

In the printed circuit board according to the present invention, the recessed portion is formed on an entire surface of the circuit pattern portion.

With this configuration, the thickness of the conductive layer at the circuit pattern portion corresponding to the recessed portion can be kept uniform, and therefore it is possible to secure a uniform wiring resistance and achieve electrical characteristics intended in the design.

In the printed circuit board according to the present invention, the recessed portion has a surface that is a convex curved surface.

With this configuration, outflow of the adhesive agent from the side surface of the conductive layer (recessed portion) can be facilitated and therefore it is possible to minimize the difference in level of the recessed portion.

In the printed circuit board according to the present invention, a plating layer is formed on a top surface of the connecting portion.

With this configuration, connections to the mounted components can be carried out reliably and a highly reliable mounted printed circuit board can be achieved.

A method for manufacturing a printed circuit board according to the present invention is provided with a step of forming a wiring pattern in which a connecting portion for connecting to a mounted component to be mounted and a circuit pattern portion that connects to the connecting portion are formed by performing patterning on a conductive layer on which an insulating layer has been laminated, and a step of forming a cover layer in which a film cover layer, in which an opening has been formed for connecting the mounted component to the connecting portion, is covered onto the insulating layer, the connecting portion, and the circuit pattern portion via an adhesive layer, wherein in the step of forming the wiring pattern, a recessed portion that is concave with respect to the connecting portion is formed in the circuit pattern portion.

With this configuration, a method for manufacturing a printed circuit board is achieved in which the recessed portion of the circuit pattern portion can be formed easily and it is possible to prevent the adhesive agent outflow portion, which is formed by adhesive agent that outflows from the adhesive layer to the opening portion, from covering the top surface of the connecting portion.

In the method for manufacturing a printed circuit board according to the present invention, a difference in level between a top surface of the connecting portion and the recessed portion is set such that an adhesive agent outflow portion, which is formed at the opening by outflow of adhesive agent from the adhesive layer due to application of heat and pressure to the film cover layer in the step of forming the cover layer, does not cover the top surface.

With this configuration, formation of the adhesive agent outflow portion is reliably suppressed and it is possible to prevent the adhesive agent outflow portion, which is formed by adhesive agent that outflows from the film cover layer to the opening portion, from extending to the top surface of the connecting portion.

In the method for manufacturing a printed circuit board according to the present invention, the recessed portion is formed by half-etching the conductive layer of the circuit pattern portion.

With this configuration, the recessed portion can be formed in combination with the forming of the circuit pattern portion and therefore the recessed portion can be formed easily and with good productivity.

DESCRIPTION OF THE PREFERRED EMBODIMENTS

Hereinafter, embodiments of the present invention will be described with reference to the accompanying drawings.

Embodiment 1

Figure 1:
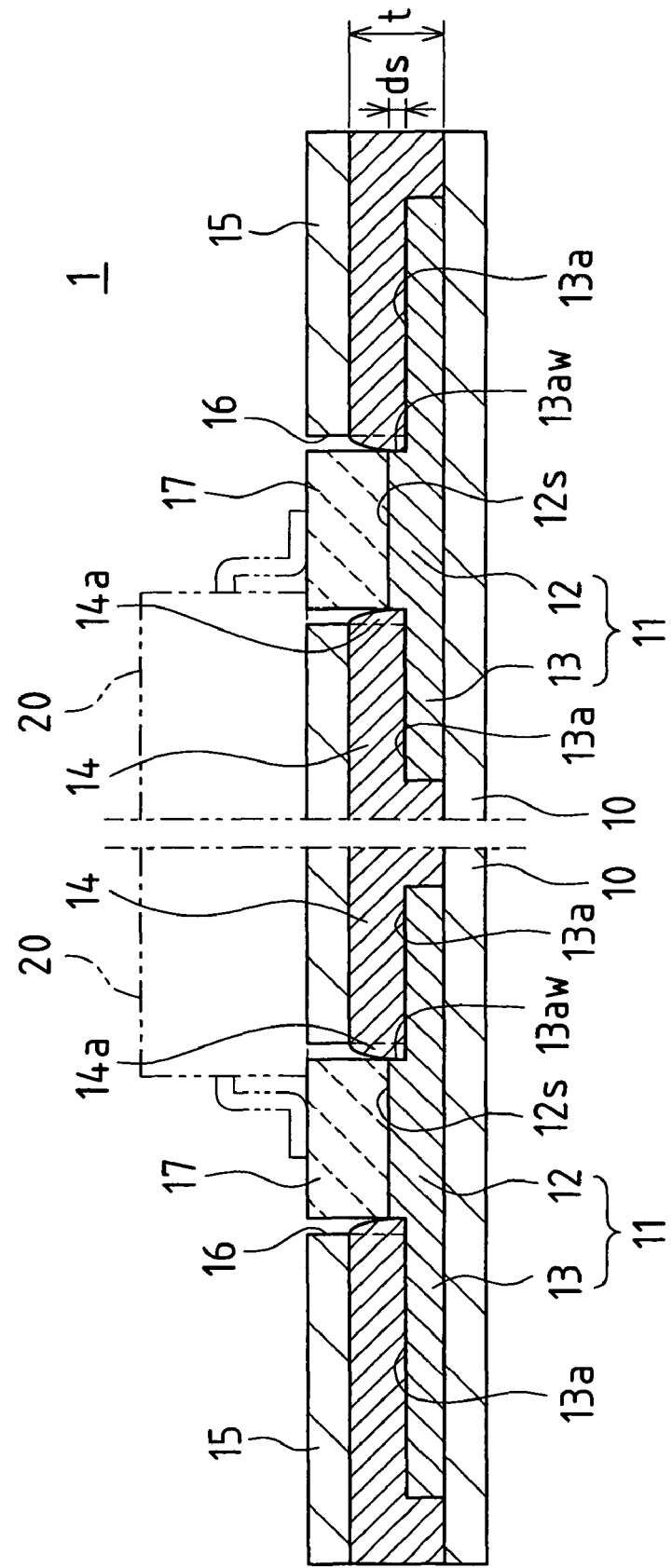
FIG. 1 is a cross-sectional view showing a schematic cross section of a printed circuit board according to Embodiment 1 of the present invention.
Figure 2A:
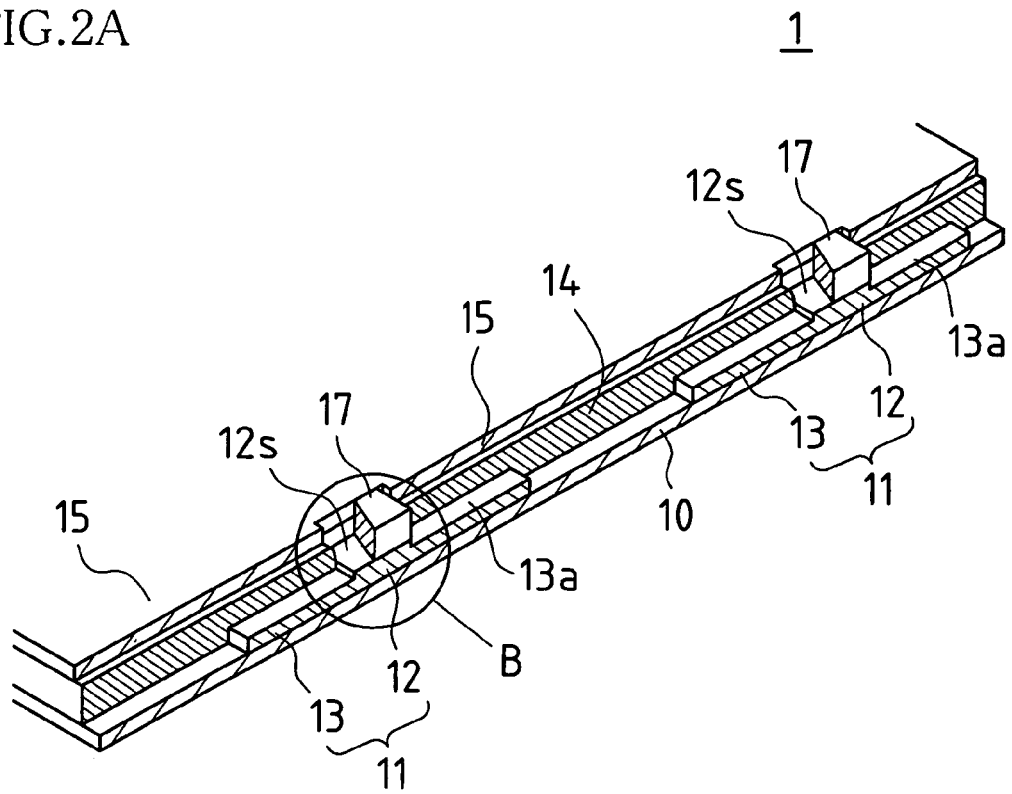
FIG. 2A is an explanatory diagram illustrating a schematic broken plane of principal components of the printed circuit board shown in FIG. 1 using an isometric projection technique and FIG. 2B shows an enlargement of an opening indicated by a circle portion B in FIG. 2A.
Figure 2B:
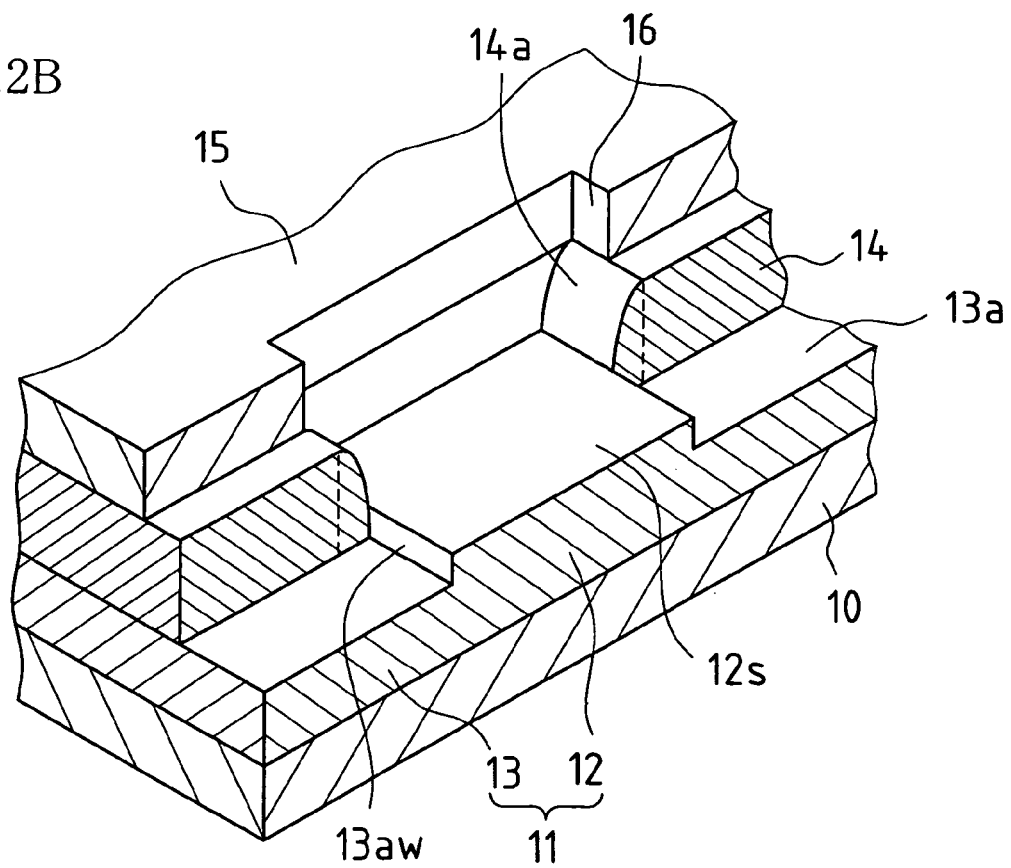
Figure 10A:
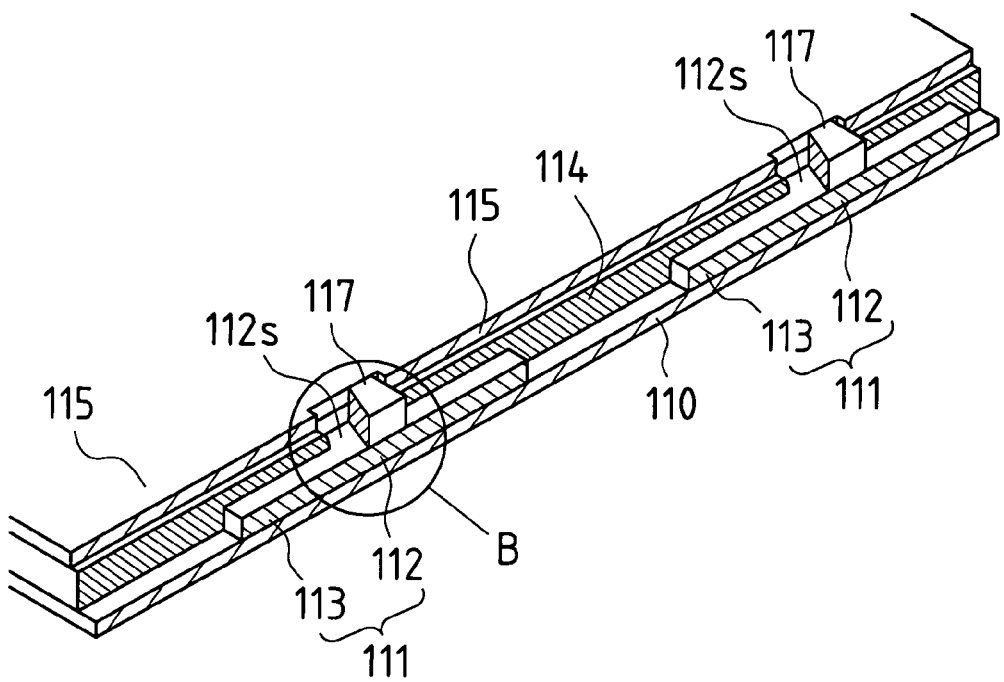
FIG. 10A is an explanatory diagram illustrating a schematic broken plane of principal components of the printed circuit board shown in FIG. 9 using an isometric projection technique and FIG. 10B shows an enlargement of an opening indicated by a circle portion B in FIG. 10A.
Figure 10B:
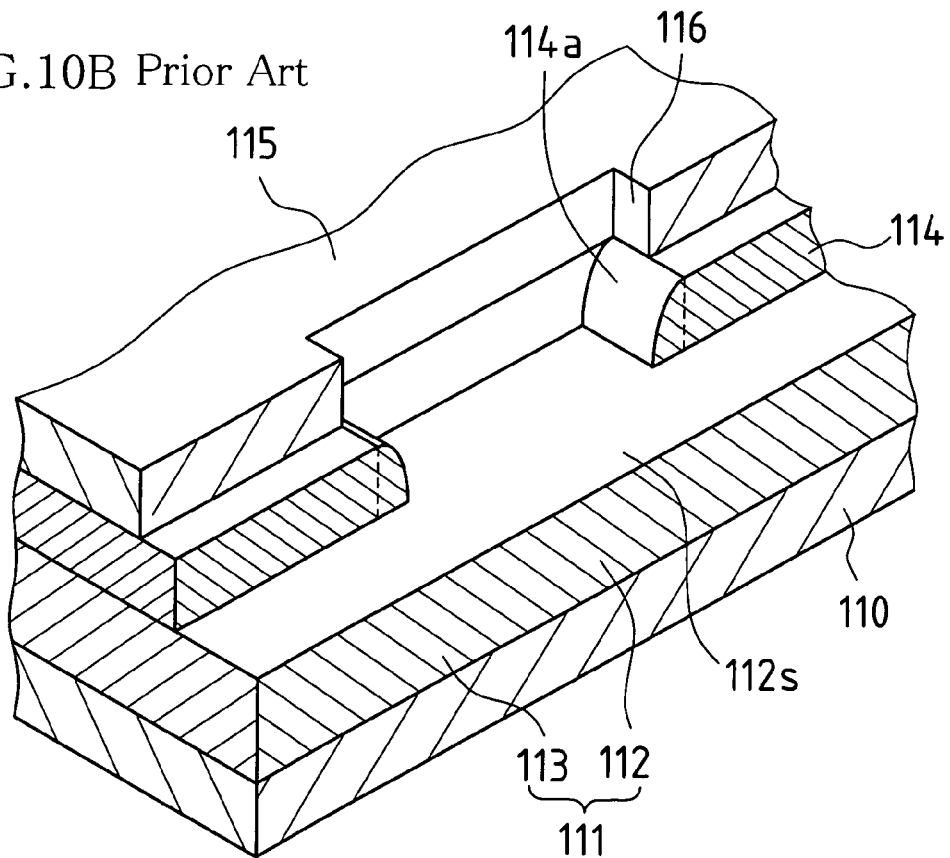
Figure 11:
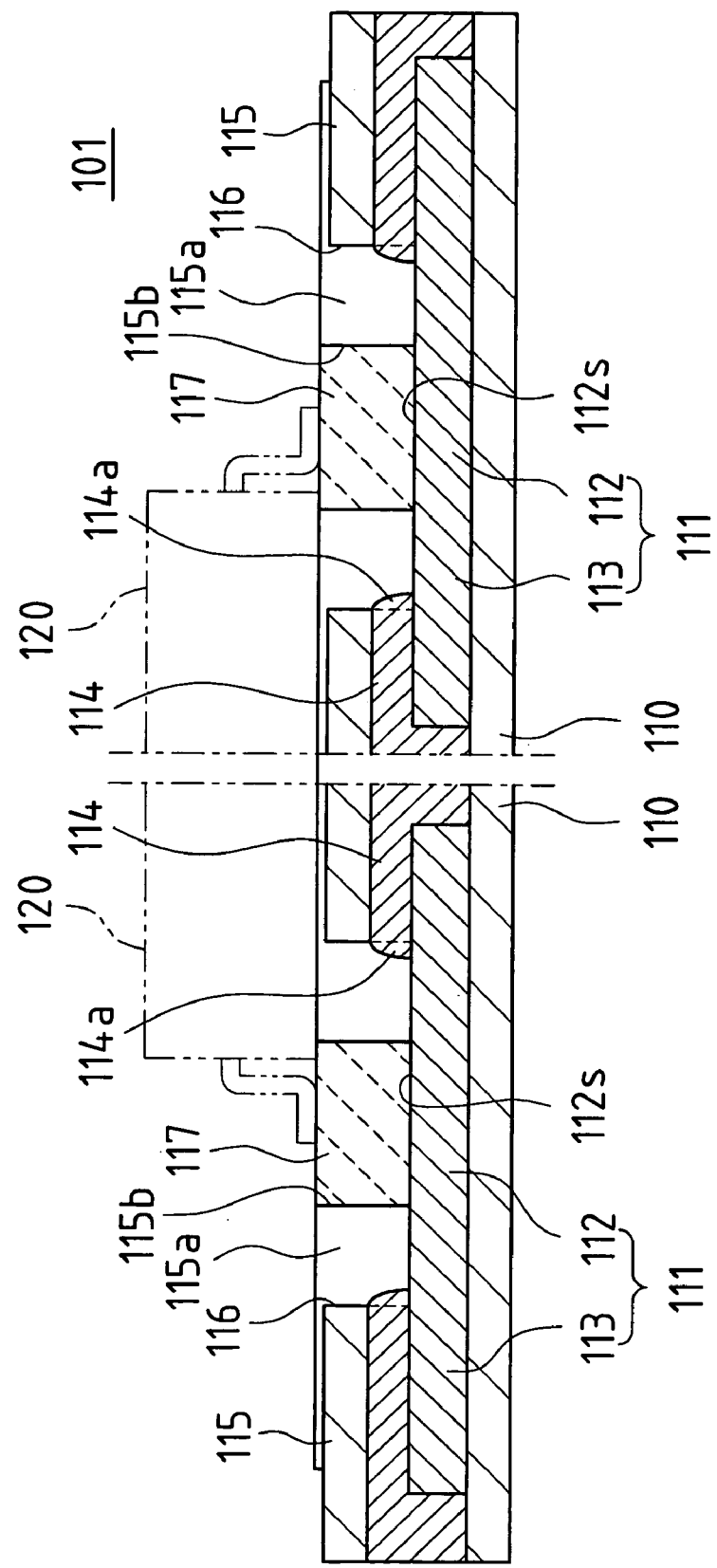
FIG. 11 is a cross-sectional view showing a schematic cross section of a printed circuit board according to Conventional Example 4.
Figure 12A:
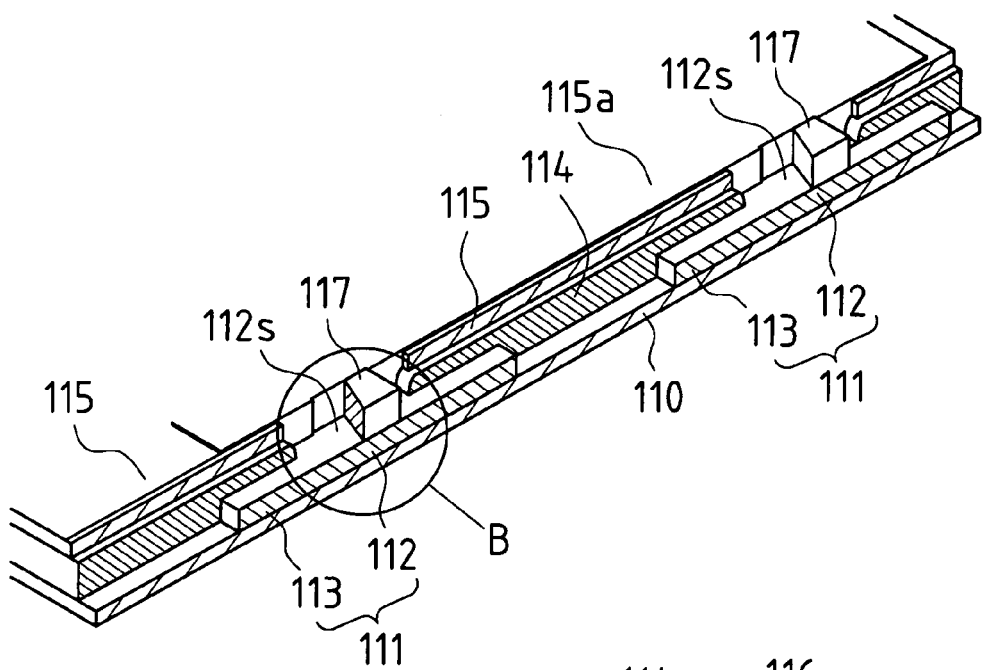
FIG. 12A is an explanatory diagram illustrating a schematic broken plane of principal components of the printed circuit board shown in FIG. 11 using an isometric projection technique and FIG. 12B shows an enlargement of an opening indicated by a circle portion B in FIG. 12A.
Figure 12B:
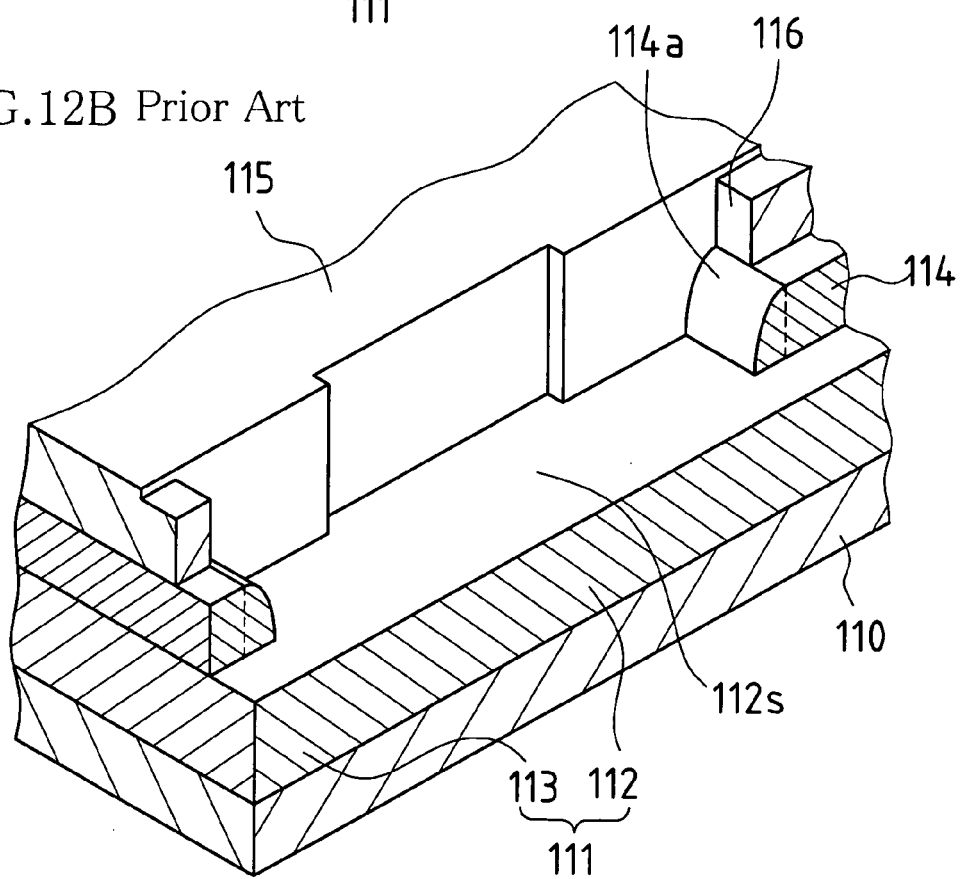
Figure 13:
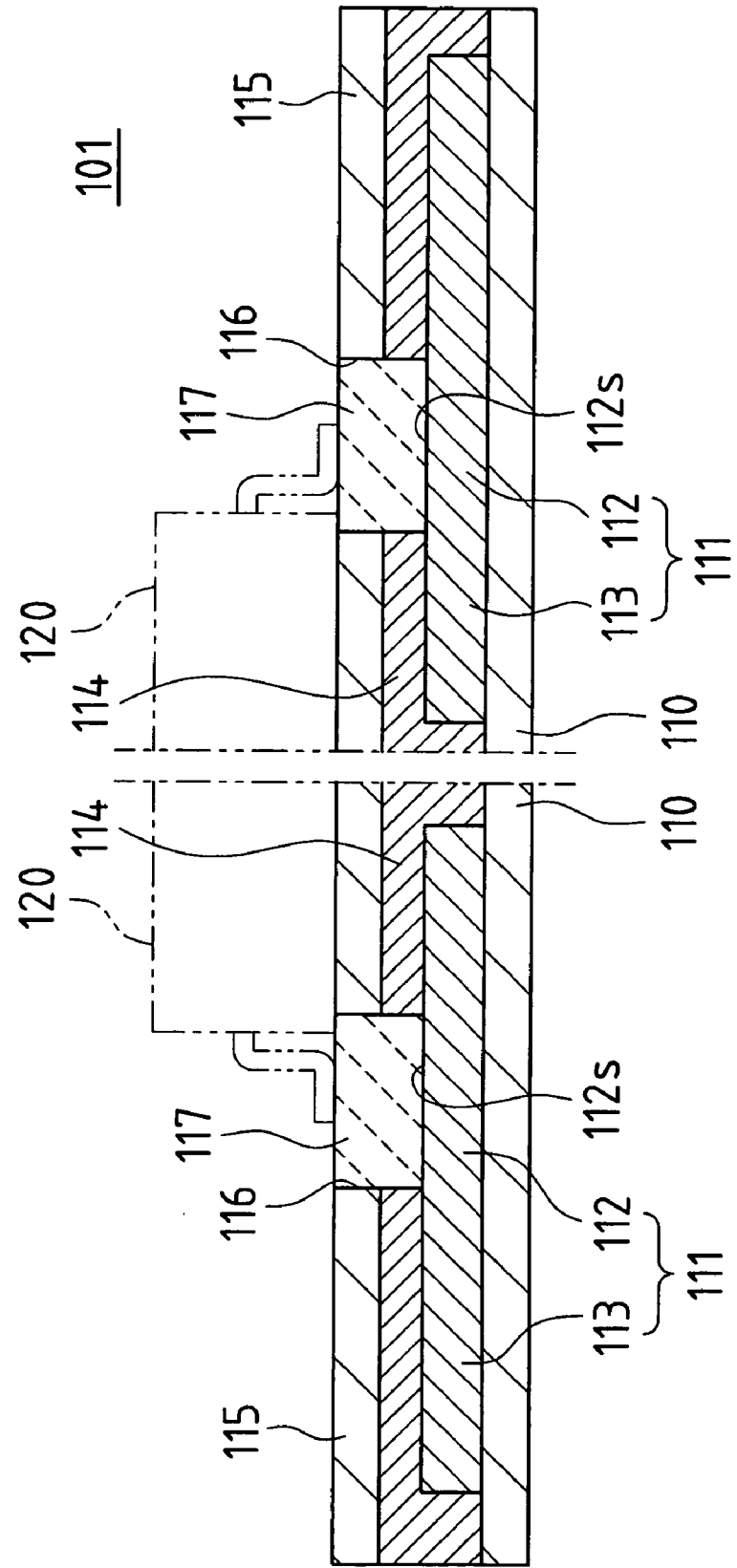
FIG. 13 is a cross-sectional view showing a schematic cross section of a printed circuit board according to Conventional Example 5.
Figure 14A:
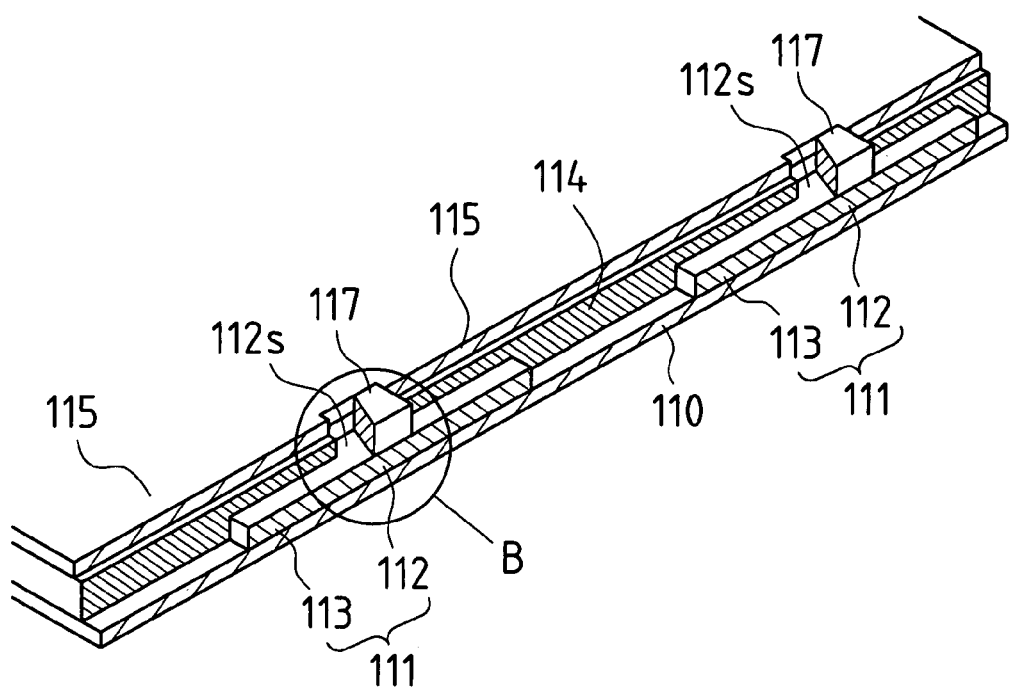
FIG. 14A is an explanatory diagram illustrating a schematic broken plane of principal components of the printed circuit board shown in FIG. 13 using an isometric projection technique and FIG. 14B shows an enlargement of an opening indicated by a circle portion B in FIG. 14A.
Figure 14B:
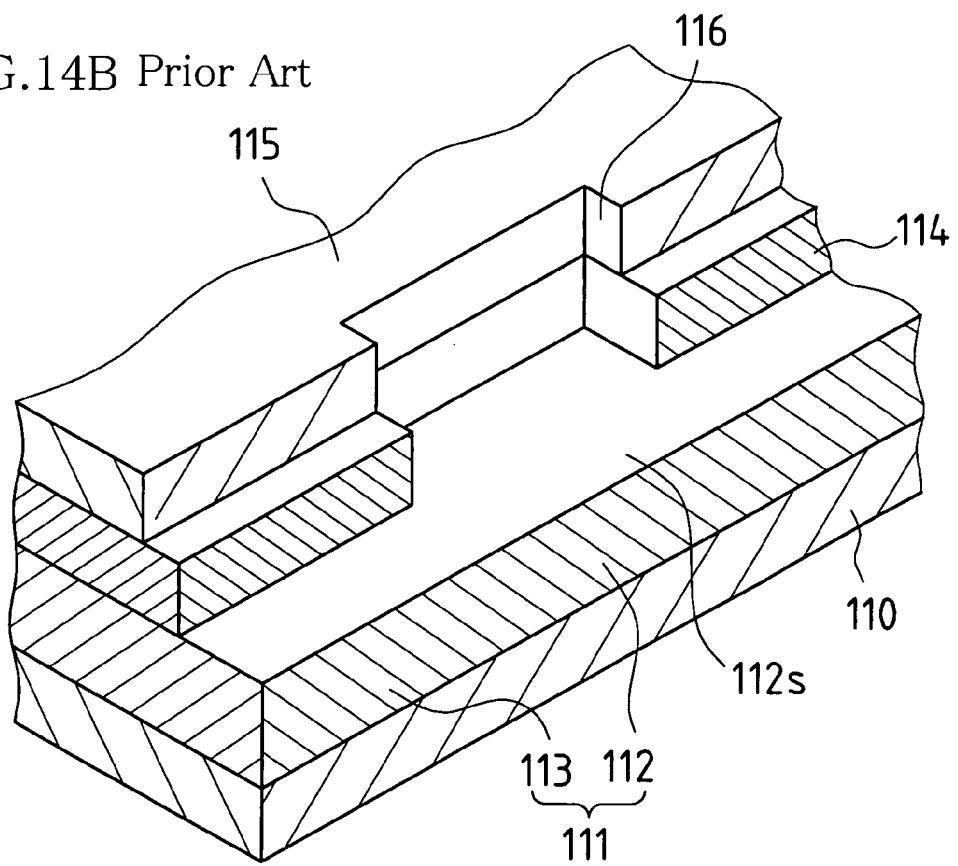

FIG. 1 is a cross-sectional view showing a schematic cross section of a printed circuit board according to Embodiment 1 of the present invention. FIG. 2A is an explanatory diagram illustrating a schematic broken plane of principal components of the printed circuit board shown in FIG. 1 using an isometric projection technique and FIG. 2B shows an enlargement of an opening indicated by a circle portion B in FIG. 2A. It should be noted that in FIG. 2A, a plating layer is shown cut midway in the opening, and in FIG. 10B the plating layer is omitted and a connecting portion is exposed.

A base material of a printed circuit board 1 according to the present embodiment is constituted by an insulating layer 10 and a conductive layer 11 laminated on the insulating layer 10. The conductive layer 11 is subjected to appropriate patterning, thereby forming a connecting portion 12 and a circuit pattern portion 13 (process of forming a wiring pattern). The connecting portion 12 includes terminal portions on which a plating layer 17 is formed for achieving connection externally, and the circuit pattern portion 13 is a circuit wiring portion that is integrally formed connected to the connecting portion 12.

In the present embodiment, a recessed portion 13a, which has a recessed shape with respect to the connecting portion 12, is formed by half-etching the circuit pattern portion 13 in the process of forming the wiring pattern. Consequently, a wall 13aw is formed at a border between the recessed portion 13a and the connecting portion 12, such that the connecting portion 12 becomes convex and forms a top surface 12s. It should be noted that by performing half-etching, it is possible to form the recessed portion 13a easily and with good productivity.

The connecting portion 12 and the circuit pattern portion 13, which are formed in the process of forming the wiring pattern, are covered by a film cover layer 15 via an adhesive layer 14 constituted by a thermosetting adhesive agent to secure mutual insulation between the outside and the wiring pattern and to improve reliability (process of forming a cover layer).

It should be noted that after an opening 16 is opened in advance so as to correspond to the connecting portion 12, the adhesive layer 14 and the film cover layer 15 are aligned with the insulating layer 10 and the conductive layer 11 so as to abut thereagainst, and thermocompression bonded by being subjected to heat and pressure. It should be noted that an inner periphery of the opening 16 is set larger than an outer periphery of the connecting portion 12 so that positional alignment can be achieved reliably and the connecting portion 12 (top surface 12s) can be exposed reliably.

When the film cover layer 15 is thermocompression bonded to the base material (the insulating layer 10 and the conductive layer 11), the adhesive layer 14 outflows in a horizontal direction since it is compressed by the applied pressure such that it is pushed out to form an adhesive agent outflow portion 14a. That is, adhesive agent protrudes from the adhesive layer 14 at the opening 16 that is provided in advance in the film cover layer 15 toward the connecting portion 12, thereby forming the adhesive agent outflow portion 14a.

However, in the present embodiment, almost all the excess adhesive agent supplied from the adhesive layer 14 is accommodated by the recessed portion 13a, and therefore the outflow volume of adhesive agent that outflows from the adhesive layer 14 to the opening 16 (toward the connecting portion 12) can be suppressed and the adhesive agent outflow portion 14a does not affect the connecting portion 12. Furthermore, even if the adhesive agent outflow portion 14a extends to the connecting portion 12, since the wall 13aw is present, flow is restrained (stopped) by the wall 13aw and the adhesive agent outflow portion 14a does not spread to the top surface 12s and cover the top surface 12s.

It should be noted that since the outer periphery of the connecting portion 12 is formed so as to be enclosed by the inner periphery of the opening 16, the wall 13aw is present between the outer periphery of the connecting portion 12 and the inner periphery of the opening 16, and therefore the adhesive agent outflow portion 14a (outflow adhesive agent) can be restrained reliably by the wall 13aw. Furthermore, a distance between the outer periphery of the connecting portion 12 and the opening 16 can be set as appropriate in consideration of the size (volume of outflow adhesive agent) of the adhesive agent outflow portion 14a that is formed such that even more reliable suppression is possible.

After the film cover layer 15 has been placed (thermocompression bonded), plating is carried out on (the top surface 12s of) the connecting portion 12 so that a mounted component 20, such as an electrical component to be mounted, can be connected to the connecting portion 12 thereby forming the plating layer 17.

In the present embodiment, by using a structure in which the recessed portion 13a is provided, it is possible to prevent the adhesive agent outflow portion 14a that is produced in the process of forming the cover layer from spreading to the top surface 12s and the plating layer 17 can be formed reliably on the connecting portion 12 (top surface 12s). That is to say, connection with the mounted component 20 that is to be mounted externally can be carried out reliably with no increase in the contact resistance with the mounted component 20 and also achieves a printed circuit board that is highly reliable with no contact defects and offers high yields.

In the present embodiment, it is considered necessary to provide a physical barrier to reliably suppress and control the adhesive agent outflow portion 14a and a configuration in which the recessed portion 13a (a difference in level ds between the top surface 12s and the recessed portion 13a) for the connecting portion 12 (top surface 12s) is provided has been devised. From the simple perspective of suppressing the adhesive agent outflow portion 14a, larger differences in level ds would appear to be preferable. However, if the difference in level ds is large when the thickness of the conductive layer 11 is prescribed to a predetermined range (specification value), then the thickness of the circuit pattern portion 13 becomes relatively thinner, and since the thickness of the circuit pattern portion 13 is thin (the cross section of the circuit pattern portion 13 becomes smaller) with respect to the thickness of the connecting portion 12, there is a risk that the wiring resistance of the circuit pattern portion 13 will become too large.

Accordingly, in order to effectively implement the present embodiment, it is desirable to comprehensively determine the difference in level ds in consideration of aspects such as the wiring resistance (conduction resistance) required by the circuit pattern portion 13, the thickness of the copper foil used as the conductive layer 11, the plating thickness of the plating layer 17, the thickness of the adhesive layer 14, and the hardness (fluidity) of the adhesive layer 14 (adhesive agent).

Furthermore, in determining the difference in level ds, when it is possible to set the thickness t of the adhesive layer 14 larger than the difference in level ds, there is fundamentally no risk of the adhesive agent outflow portion 14a covering the top surface 12s, and therefore it is important to prescribe a smallest thickness t by which the adhesive agent outflow portion 14a can be reliably suppressed. However, setting the difference in level ds to zero even when there is little fluidity of the adhesive layer 14 (adhesive agent) results in an absence of the above-described physical barrier, and is therefore not preferable.

In other words, since the tolerance (unevenness) in the thickness, hardness, and the like of the structural materials is generally about 10%, in consideration of unevenness occurring in the adhesive agent outflow portion 14a due to unevenness in materials and processing, it is preferable that the difference in level ds is formed so as to be at least 20% greater than the thickness t of the adhesive layer 14 in order to secure stability, reliability, and controllability in the manufacturing processes. That is, in order to make it possible to reliably suppress the adhesive agent outflow portion 14a even when there is unevenness in materials and processing while suitably maintaining the thickness of the conductive layer 11, it is preferable that the difference in level ds between the connecting portion 12 and the recessed portion 13a is set at least 20% larger than the thickness of the adhesive layer 14.

With this configuration, it becomes possible to reliably constrain and suppress spreading of the adhesive agent outflow portion 14a according to flow characteristics of the adhesive agent of the adhesive layer 14 while suitably maintaining the thickness of the conductive layer 11.

Furthermore, in the present embodiment, the recessed portion 13a is formed on an entire surface of the circuit pattern portion 13. With this configuration, in selecting the base material of the printed circuit board 1, it is possible to determine in advance the thickness of the conductive layer 11 with the assumption that half-etching is to be carried out on the conductive layer 11. Moreover, the thickness of the conductive layer 11 at the circuit pattern portion 13 can be made uniform, and therefore it is possible to secure a uniform wiring resistance and achieve electrical characteristics intended in the design.

Embodiment 2

Figure 3:
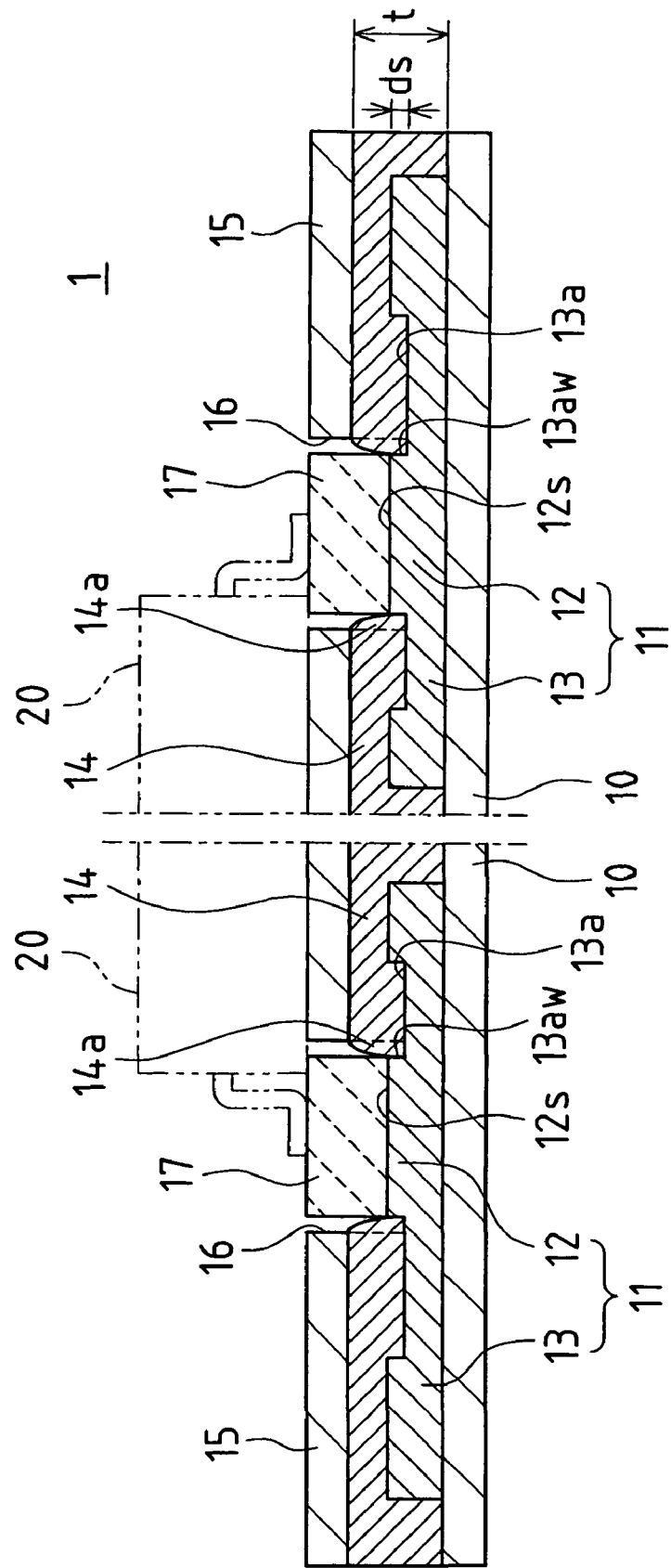
FIG. 3 is a cross-sectional view showing a schematic cross section of a printed circuit board according to Embodiment 2 of the present invention.
Figure 4A:
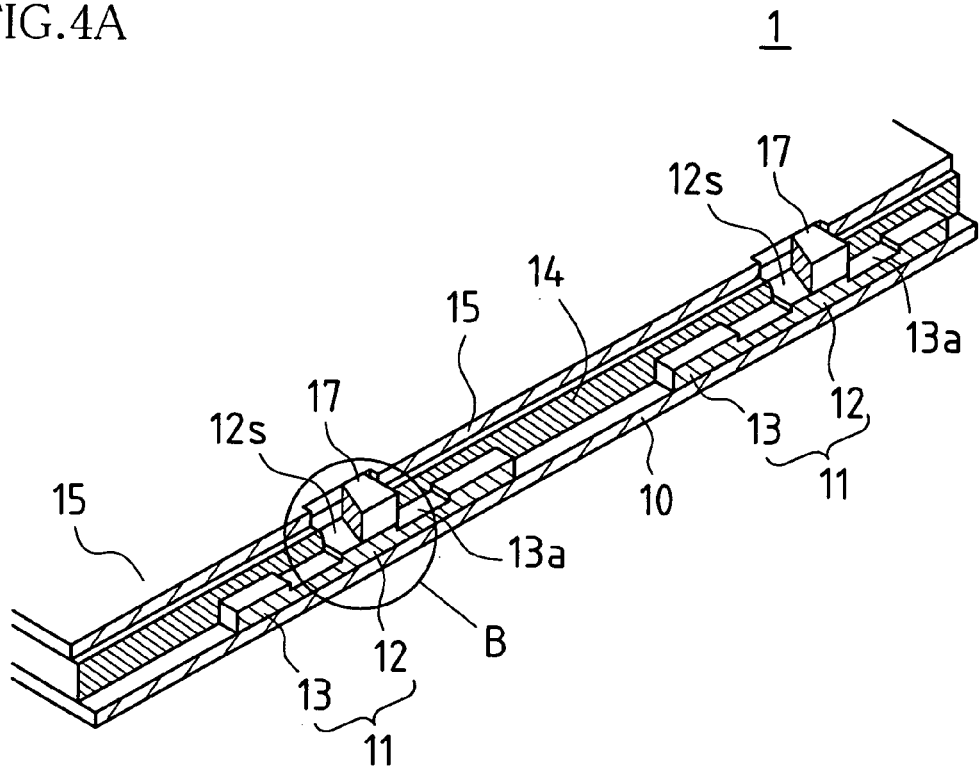
FIG. 4A is an explanatory diagram illustrating a schematic broken plane of principal components of the printed circuit board shown in FIG. 3 using an isometric projection technique and FIG. 4B shows an enlargement of an opening indicated by a circle portion B in FIG. 4A.
Figure 4B:
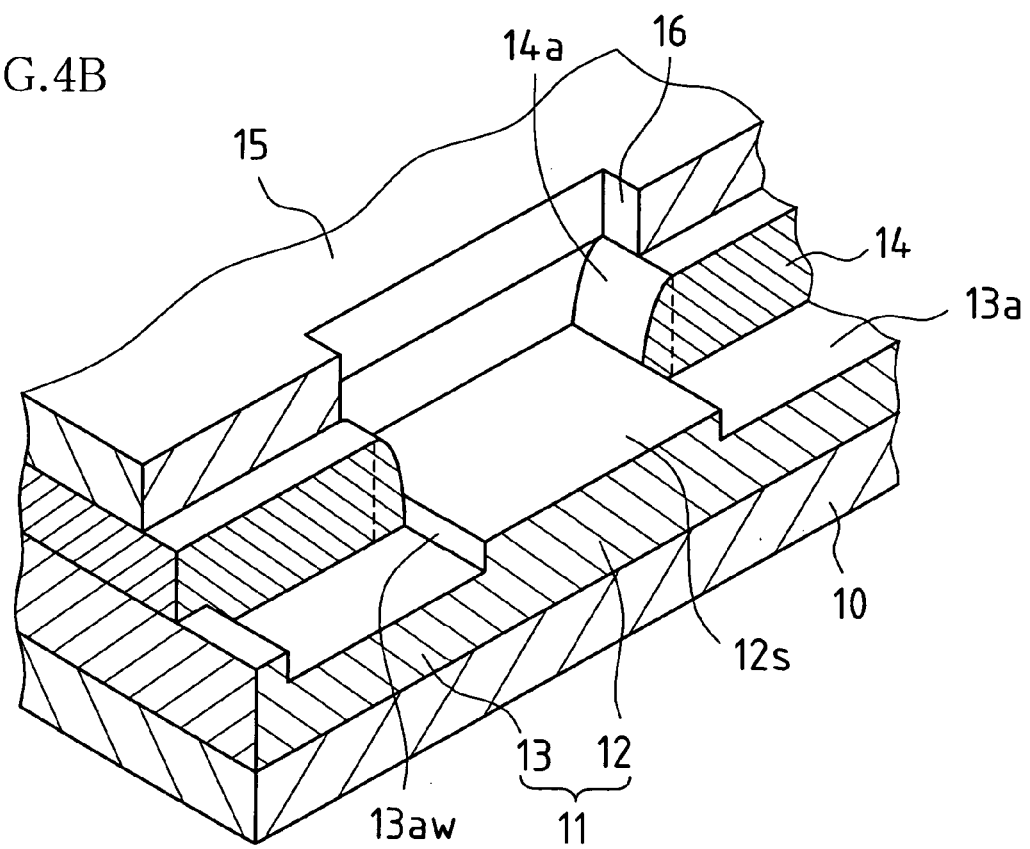

FIG. 3 is a cross-sectional view showing a schematic cross section of a printed circuit board according to Embodiment 2 of the present invention. FIG. 4A is an explanatory diagram illustrating a schematic broken plane of principal components of the printed circuit board shown in FIG. 3 using an isometric projection technique and FIG. 4B shows an enlargement of an opening indicated by a circle portion B in FIG. 4A. It should be noted that in FIG. 4A, a plating layer is shown cut midway in the opening, and in FIG. 4B the plating layer is omitted and a connecting portion is exposed. Furthermore, identical symbols are attached to the same structures as in Embodiment 1 and detailed description thereof is omitted as appropriate.

In the present embodiment, the recessed portion 13a provided by half-etching the circuit pattern portion 13 is formed as a shape that straddles the opening 16, partially arranged on both sides of the opening 16. That is, the recessed portion 13a is partially formed spanning from the connecting portion 12 to one part of a region of the circuit pattern portion 13 so as to straddle the opening 16 of the film cover layer 15.

When thermocompression bonding the film cover layer 15, the circuit pattern portion 13, which occupies the highest position of the base material, is subjected to the greatest pressure load, thereby forming a large adhesive agent outflow portion 14a with adhesive agent that outflows from this area. That is, by forming the circuit pattern portion 13 in a low position, it is possible to reduce the pressure that is applied and reduce the amount of adhesive agent that outflows.

Accordingly, in the present embodiment, it is possible to restrain the adhesive agent outflow portion 14a using the wall 13aw of the recessed portion 13a and to reduce the pressure applied to the adhesive layer 14 by the thermocompression bonding of the film cover layer 15 at the outer periphery of the opening 16 at which the recessed portion 13a is formed. That is, it is possible to suppress and control the formation of the adhesive agent outflow portion 14a by suppressing the outflow of adhesive agent to the opening 16.

In the present embodiment, the compression strength of the film cover layer 15 in regions corresponding to the recessed portion 13a is partially less compared to other regions corresponding to the circuit pattern portion 13, but sufficient bonding force is secured in other wide regions of the circuit pattern portion 13 and additionally regions where the circuit pattern portion 13 is not formed are also compressed, and therefore a sufficient bonding force can be maintained.

It should be noted that extra recessed portions may be appropriately formed as necessary in other regions of the circuit pattern portion 13 where the recessed portion 13a is not formed, and an effect of reducing the pressure applied can be achieved with these recessed portions in the same manner as the recessed portion 13a.

Embodiment 3

Figure 5:
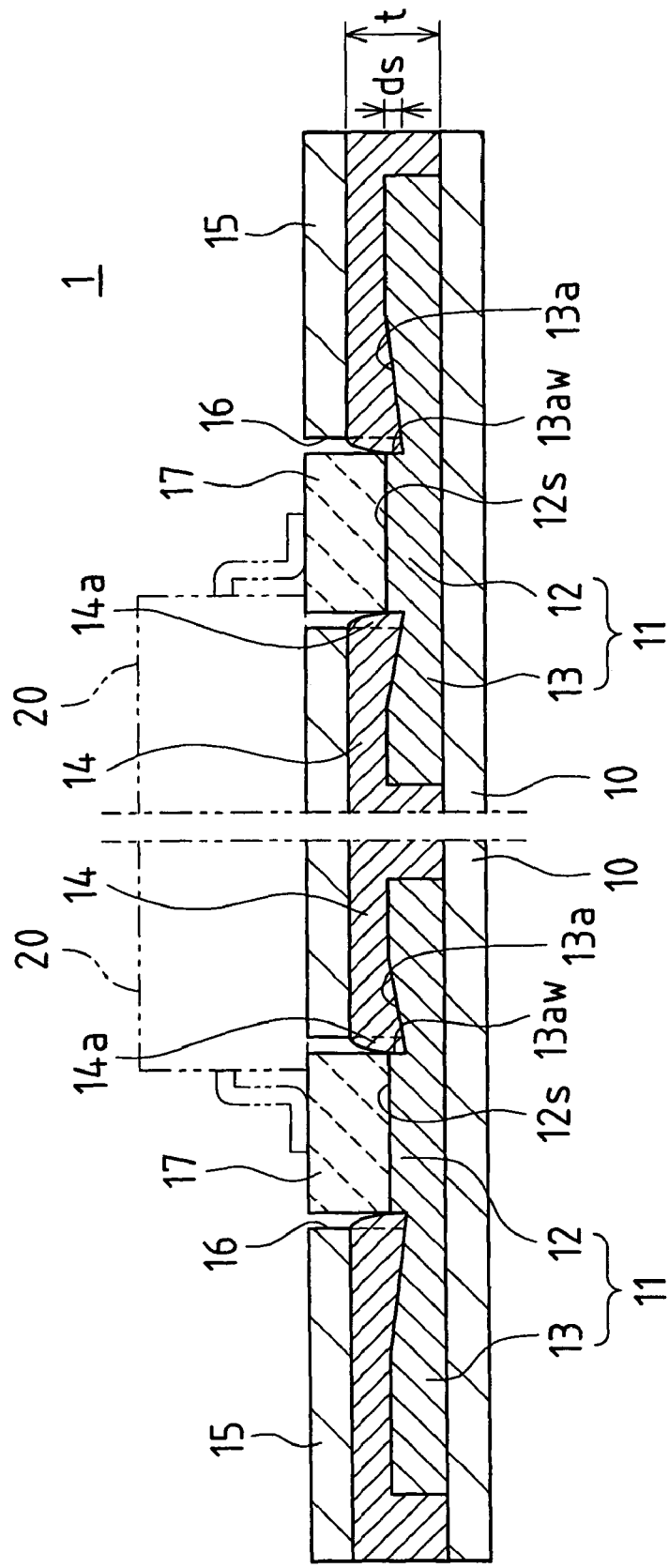
FIG. 5 is a cross-sectional view showing a schematic cross section of a printed circuit board according to Embodiment 3 of the present invention.
Figure 6A:
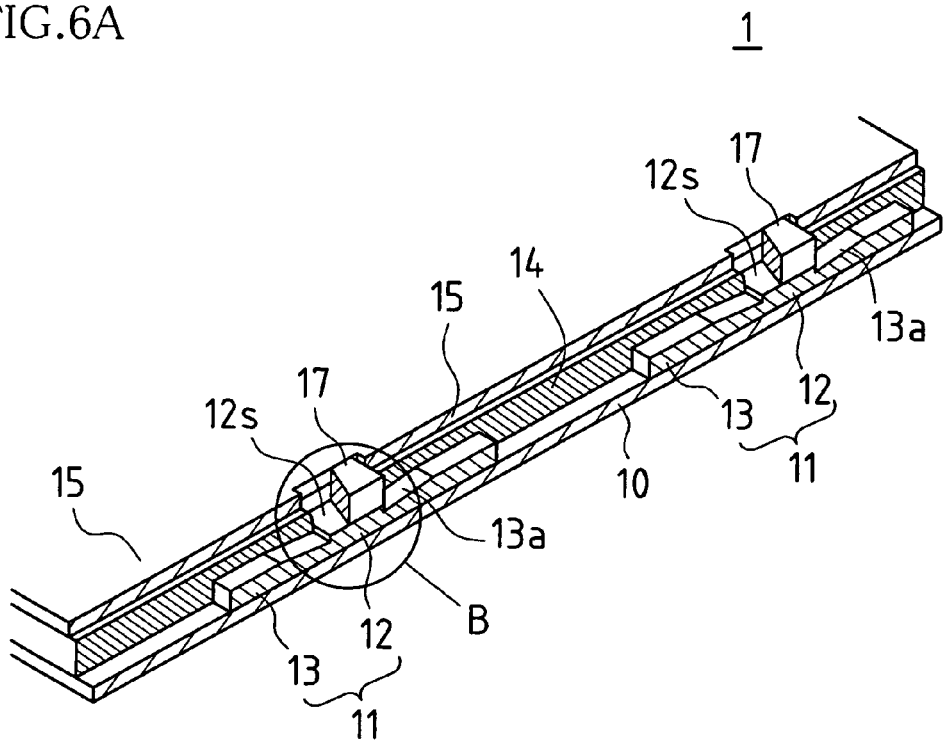
FIG. 6A is an explanatory diagram illustrating a schematic broken plane of principal components of the printed circuit board shown in FIG. 5 using an isometric projection technique and FIG. 6B shows an enlargement of an opening indicated by a circle portion B in FIG. 6A.
Figure 6B:
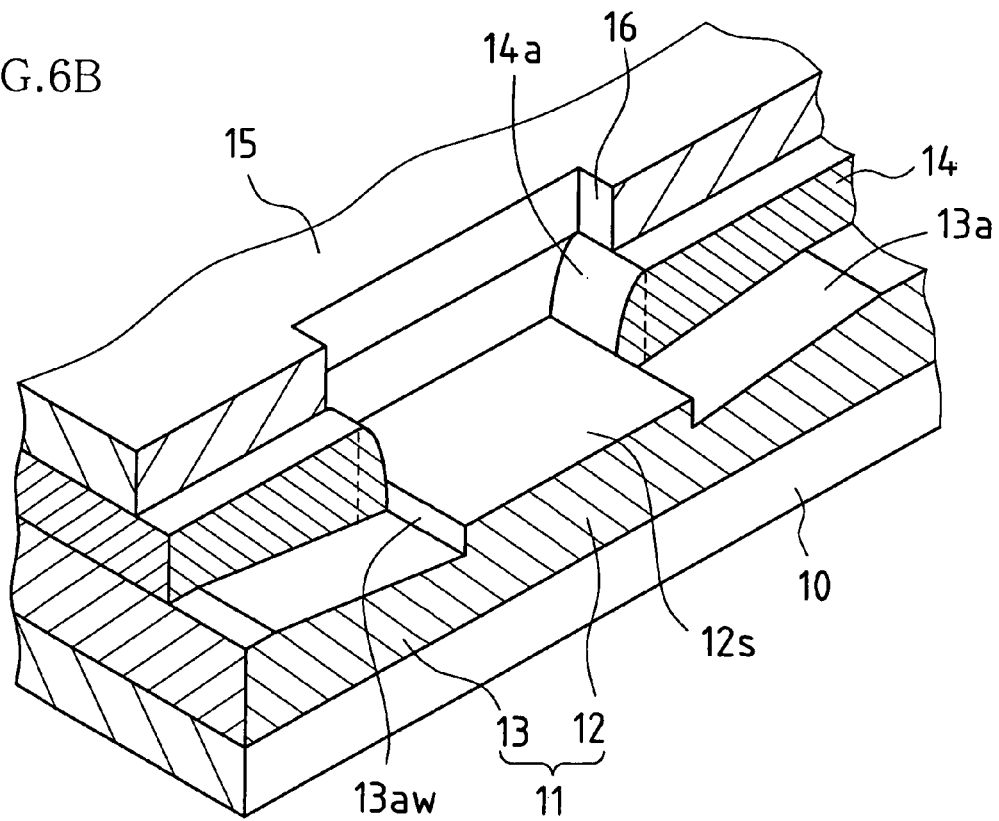

FIG. 5 is a cross-sectional view showing a schematic cross section of a printed circuit board according to Embodiment 3 of the present invention. FIG. 6A is an explanatory diagram illustrating a schematic broken plane of principal components of the printed circuit board shown in FIG. 5 using an isometric projection technique and FIG. 6B shows an enlargement of an opening indicated by a circle portion B in FIG. 6A. It should be noted that in FIG. 6A, a plating layer is shown cut midway in the opening, and in FIG. 6B the plating layer is omitted and a connecting portion is exposed. Furthermore, identical symbols are attached to the same structures as in Embodiment 1 and detailed description thereof is omitted as appropriate.

In the present embodiment, the recessed portion 13a is partially formed on both sides of the opening 16 straddling the opening 16 so as to become gradually shallower as it becomes further away from the opening 16. That is, the recessed portion 13a is deepest at a position corresponding to the opening 16 (connecting portion 12) and has a slant that becomes shallower as it becomes further away from the opening 16, and the thickness of the circuit pattern portion 13 (conductive layer 11) in regions away from the opening 16 is set level as is regular. Accordingly, the cross section area of the conductive layer 11 of the circuit pattern portion 13 corresponding to the recessed portion 13a can be secured in its entirety, and therefore it is possible to suppress increases in the wiring resistance at the circuit pattern portion 13 corresponding to the recessed portion 13a.

With the present embodiment, it is possible suppress increases in the wiring resistance at the circuit pattern portion 13 corresponding to the recessed portion 13a while maintaining the same effect as in Embodiment 2. Moreover, combined use with Embodiment 2 is possible as appropriate.

Embodiment 4

Figure 7:
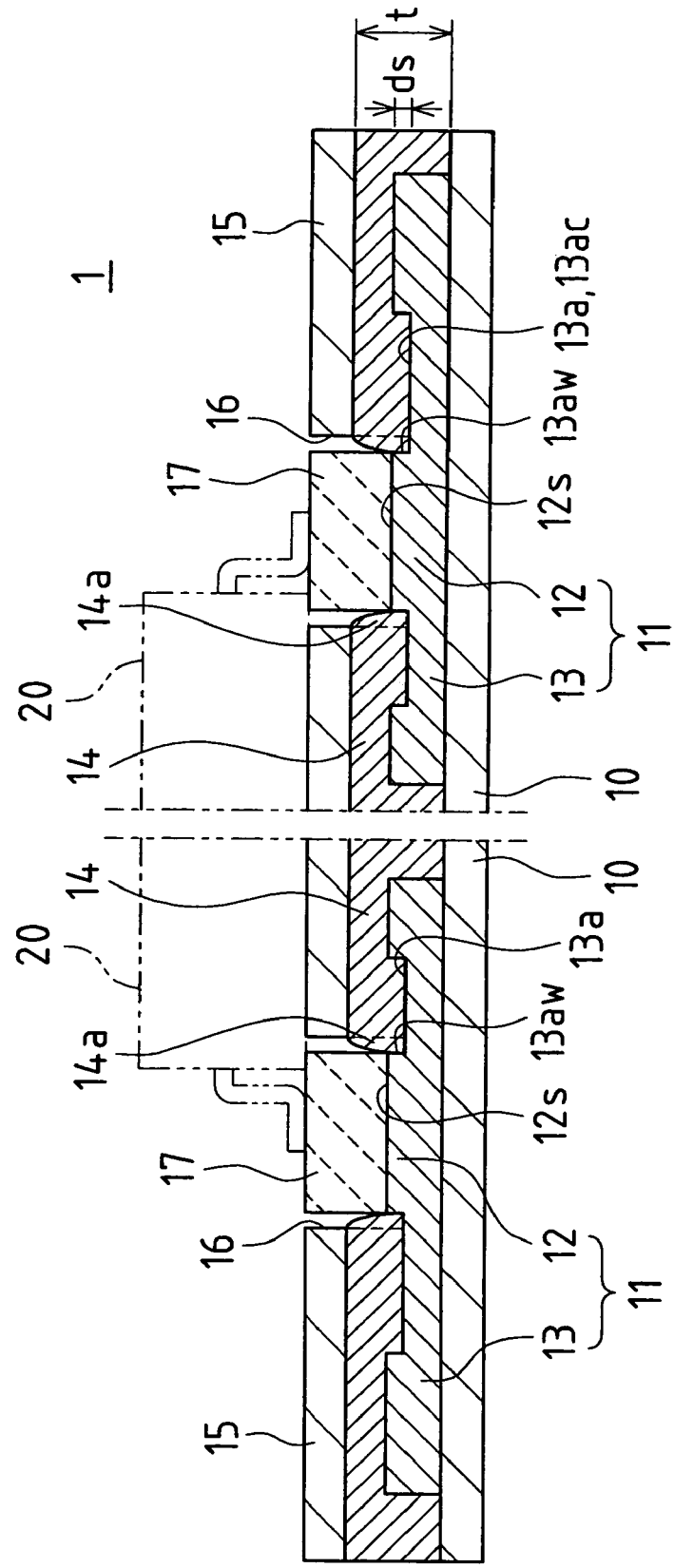
FIG. 7 is a cross-sectional view showing a schematic cross section of a printed circuit board according to Embodiment 4 of the present invention.
Figure 8A:
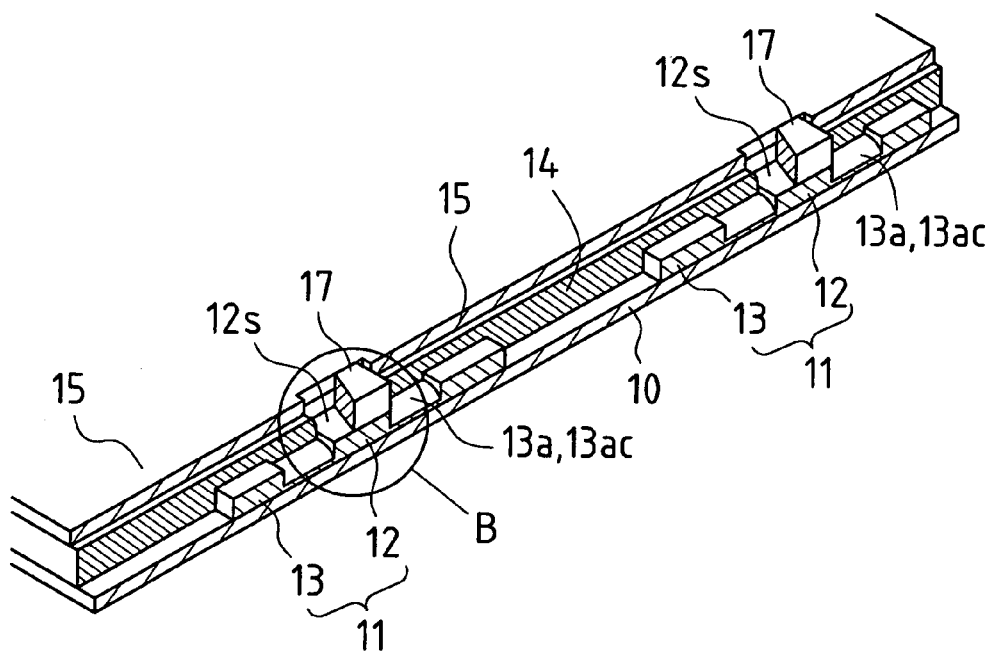
FIG. 8A is an explanatory diagram illustrating a schematic broken plane of principal components of the printed circuit board shown in FIG. 7 using an isometric projection technique and FIG. 8B shows an enlargement of an opening indicated by a circle portion B in FIG. 8A.
Figure 8B:
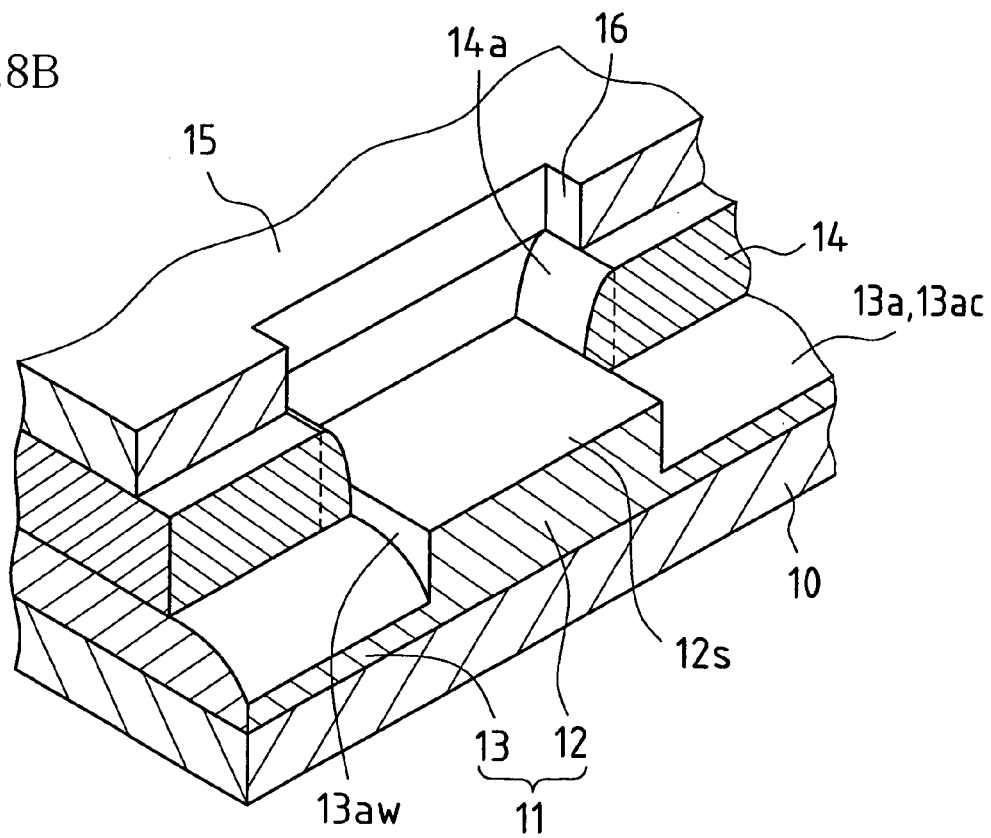
Figure 9:
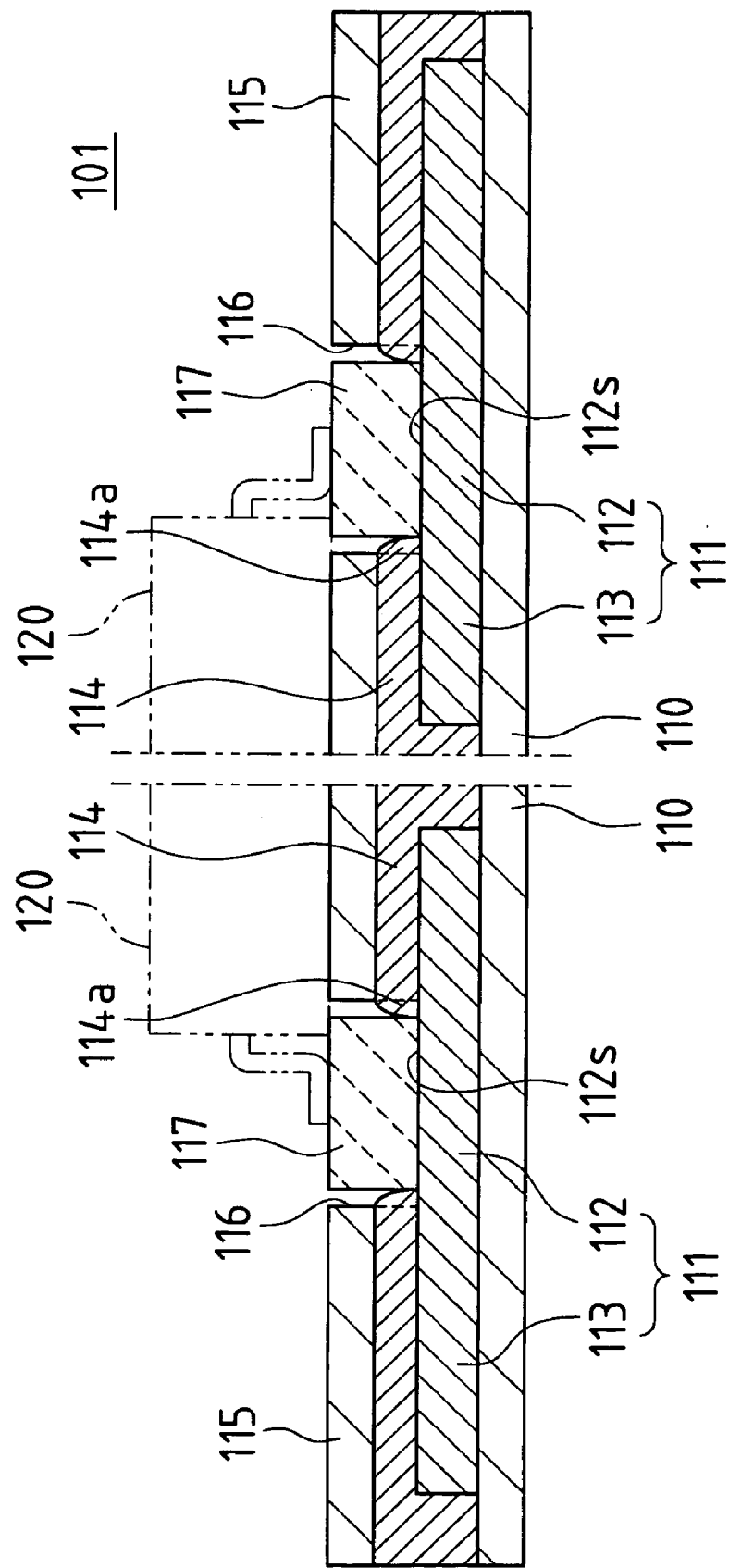
FIG. 9 is a cross-sectional view showing a schematic cross section of a printed circuit board according to Conventional Example 1.

FIG. 7 is a cross-sectional view showing a schematic cross section of a printed circuit board according to Embodiment 4 of the present invention. FIG. 8A is an explanatory diagram illustrating a schematic broken plane of principal components of the printed circuit board shown in FIG. 7 using an isometric projection technique and FIG. 8B shows an enlargement of an opening indicated by a circle portion B in FIG. 8A. It should be noted that in FIG. 8A, a plating layer is shown cut midway in the opening, and in FIG. 8B the plating layer is omitted and a connecting portion is exposed. Furthermore, identical symbols are attached to the same structures as in Embodiment 1 and detailed description thereof is omitted as appropriate.

In the present embodiment, a surface (upper side surface in the drawing) of the recessed portion 13a is set to a convex curved surface 13ac such that a thickness of the conductive layer 11 becomes thinner at end portions (lateral direction). The curved surface 13ac can be set to a semicircular cylinder shape such as a semicylindrical shape.

As described above, the adhesive layer 14, which covers and abuts the circuit pattern portion 13, has its adhesive agent pushed out horizontally by thermocompression bonding and the adhesive agent that outflows toward the opening 16 forms the adhesive agent outflow portion 14a. Accordingly, by setting a surface of the recessed portion 13a as the curved surface 13ac and making the thickness of the conductive layer 11 thinner at end portions (lateral direction), it is possible to make the adhesive agent outflow more easily at the end portions (lateral direction) of the curved surface 13ac.

That is, in the present embodiment, excess adhesive agent outflows in a lateral direction of the curved surface 13ac and is contained in a region other than the opening 16, and therefore it is possible to suppress outflow of adhesive agent toward the opening 16. Moreover, since the recessed portion 13a has a shape that becomes deeper as being closer to the side surfaces, the adhesive agent outflows more easily and it becomes possible to minimize the difference in level ds of the recessed portion 13a and reduce the total recessed volume to the extent possible.

Accordingly, it becomes possible to suppress any increase in the wiring resistance of the circuit pattern portion 13 to the extent possible while suppressing the adhesive agent outflow portion 14a formed by adhesive agent that has out flowed toward the opening 16. It should be noted that the present embodiment also can be applied to the other embodiments.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A printed circuit board comprising:
   an insulating layer,
   a conductive layer that is laminated on the insulating layer and that has a connecting portion for connecting a mounted component to be mounted and a circuit pattern portion formed connected to the connecting portion, and
   a film cover layer that covers the insulating layer and the conductive layer via an adhesive layer and that has an opening for connecting the mounted component to the connecting portion,
   wherein the circuit pattern portion has a recessed portion that is concave with respect to the connecting portion, and
   wherein the thickness of the circuit pattern portion of the conductive layer increases when moving outwardly from the connecting portion of the conductive layer.

2. The printed circuit board according to claim 1, wherein an outer periphery of the connecting portion is enclosed by an inner periphery of the opening.

3. The printed circuit board according to claim 1, wherein a difference in level between the connecting portion and the recessed portion is set greater than 20% of a thickness of the adhesive layer.

4. The printed circuit board according to claim 1, wherein the recessed portion is formed straddling the opening.

5. The printed circuit board according to claim 1, wherein the recessed portion has a surface that is a convex curved surface.

6. The printed circuit board according to claim 1, wherein a plating layer is formed on a top surface of the connecting portion.

7. The printed circuit board according to claim 2, wherein a difference in level between the connecting portion and the recessed portion is set greater than 20% of a thickness of the adhesive layer.

8. The printed circuit board according to claim 2, wherein the recessed portion is formed straddling the opening.

9. The printed circuit board according to claim 3, wherein the recessed portion is formed straddling the opening.

10. The printed circuit board according to claim 4, wherein the recessed portion is formed so as to become incrementally shallower farther from the opening.

11. The printed circuit board according to claim 4, wherein the recessed portion is formed on an entire surface of the circuit pattern portion.

12. The printed circuit board according to claim 7, wherein the recessed portion is formed straddling the opening.

13. The printed circuit board according to claim 8, wherein the recessed portion is formed so as to become incrementally shallower farther from the opening.

14. The printed circuit board according to claim 8, wherein the recessed portion is formed on an entire surface of the circuit pattern portion.

15. The printed circuit board according to claim 9, wherein the recessed portion is formed so as to become incrementally shallower farther from the opening.

16. The printed circuit board according to claim 9, wherein the recessed portion is formed on an entire surface of the circuit pattern portion.

17. The printed circuit board according to claim 12, wherein the recessed portion is formed so as to become incrementally shallower farther from the opening.

18. The printed circuit board according to claim 12, wherein the recessed portion is formed on an entire surface of the circuit pattern portion.

* * * * *